(12) United States Patent
Hotchkiss et al.

(10) Patent No.: US 6,303,407 B1
(45) Date of Patent: Oct. 16, 2001

(54) METHOD FOR THE TRANSFER OF FLUX COATED PARTICLES TO A SUBSTRATE

(75) Inventors: Gregory B. Hotchkiss, Richardson; Gonzalo Amador, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/229,621

(22) Filed: Jan. 13, 1999

Related U.S. Application Data
(60) Provisional application No. 60/073,639, filed on Feb. 4, 1998.

(51) Int. Cl.[7] ............................ H01L 21/44; H01L 21/48; H01L 21/50
(52) U.S. Cl. ............................................. 438/106; 438/612
(58) Field of Search .................................... 438/106, 612, 438/613, 618, 108, 754; 264/109, 349; 427/204, 205, 199, 314, 346, 533

(56) References Cited

U.S. PATENT DOCUMENTS

| | | | | |
|---|---|---|---|---|
| 4,360,570 | * | 11/1982 | Andreades et al. | 156/237 |
| 5,785,913 | * | 7/1998 | Clark, Jr. et al. | 264/109 |
| 6,071,801 | * | 6/2000 | Wachtler et al. | 438/612 |
| 6,143,374 | * | 11/2000 | Cairncross et al. | 427/533 |

* cited by examiner

Primary Examiner—David Nelms
Assistant Examiner—Phuc T. Dang
(74) Attorney, Agent, or Firm—Gary C. HoneyCutt; Fred Telecky; Arthur I. Navarro

(57) ABSTRACT

A method for loading solder particles (14) onto an substrate comprising applying a flux (18) directly onto solder particles (14) either prior to or following adhering the solder particles (14) onto adhesive areas (30) of an adhesive coated film (20). The adhesive areas (30) of the adhesive coated film (20) are oriented to correspond with contact pads (42) of a substrate (16). The adhesive coated film (20) is aligned with the substrate (16) to transfer the solder particles (14) to the contact pads (42). The solder particles (14) may then be reflowed to securely attach the solder particles (14) to the contact pads(42).

11 Claims, 3 Drawing Sheets

METHOD FOR THE TRANSFER OF FLUX COATED PARTICLES TO A SUBSTRATE

This application claims priority under 35 USC §119(e)(1) of provisional application number 60/073,639, filed Feb. 4, 1998.

TECHNICAL FIELD OF THE INVENTION

The present invention relates in general to the field of electronic device packaging and more particularly to a method and apparatus for applying solder flux to solder spheres and transferring flux coated solder spheres to a substrate.

BACKGROUND OF THE INVENTION

Without limiting the scope of the invention, its background is described in connection with electronic device packaging, as an example.

Modern electronic components utilize numerous integrated circuits. These integrated circuits must often be electrically connected to each other or to other electronic components. One method for connecting integrated circuits to electronic components utilizes an area array electronic package, such as a ball-grid array (BGA) package or a flip-chip package. The electrical connections between an integrated circuit packaged in an area array package design and a printed circuit board (PCB) are typically composed of solder.

With ball grid array packages, various input and output ports of an integrated circuit are typically connected via wire bonds to contact pads of the ball grid array electronic package. Solder balls formed on the contact pads of the ball grid array electronic package are used to complete the connection to another electronic component, such as a printed circuit board (PCB).

Integrated circuits are also connected to electronic components through a flip-chip electronic package design. The flip-chip electronic package is similar to the ball grid array electronic package in that solder balls are used to make a connection with other electronic components, such as a PCB. Solder balls are also used in a flip-chip design to attach the input and output ports of the substrate to the contact pads of the integrated circuit. As such, flip-chip packages do not require wire bonds. These solder balls or bumps may be formed on the face of integrated circuits as they reside on semiconductor wafers before being sawed into individual dies.

Therefore, an important step in the interconnection of many electronic components is the formation and attachment of solder balls.

Heretofore, in this field, solder bumps or balls have been typically formed utilizing one of four methods: (1) printing of solder paste through a stencil or mask; (2) electroplating; (3) evaporation; or (4) mechanical transfer of preformed solder spheres. While electroplating, printing of solder paste through a stencil or mask, and evaporation techniques have been typically utilized for forming solder bumps on wafers and integrated circuits, BGA and chip-scale packages (CSP) have commonly utilized printing of solder paste and mechanical transfer of solder ball techniques.

Transfer of solder balls has been customarily achieved, by means of vacuum chucks or machined templates. Another method for transferring preformed solder balls utilizes formation of a pattern of dots onto a photoimageable coating laminated to an organic film. Typically the organic film is composed of a material having a high melting temperature that is capable of being exposed to temperatures exceeding 200° C. with very little degradation, such as polyimide.

The pattern is formed by placing a photomask on the coating and then exposing the coating to a dose of ultraviolet radiation. For example, for an area array package design, the photomask contains a mirror image of the contact pads design. The areas protected by the photomask design retain their adhesiveness while the unprotected areas exposed to the ultraviolet radiation lose their adhesiveness. The array of adhesive areas corresponds to the pattern of contact pads found on the substrate, wafer or die to receive the solder connections.

After the adhesive areas are formed, solder balls are loaded onto the surface of the film and attach to the adhesive areas. The excess solder balls that lie on non-adhesive areas are removed. The populated film is then aligned and brought into contact with contact pads, which may be fluxed. A solder reflow is performed to transfer the solder balls from the adhesive areas to the contact pads of the substrate. Following the reflow cycle, the film is removed from the solder balls.

Before a solder sphere is reflowed to a contact pad, solder flux is usually applied to either the pad and/or the sphere to facilitate the removal of any oxides or other layers of contamination that may prevent a good sphere to pad adhesion. Solder fluxes contain organic based acids for removing the oxides. For conventional area array applications such as flip chip wafers, printed circuit boards (PCB), and ball grid arrays (BGA), the flux is; typically applied directly to the substrate by forcing the flux through a screen or stencil. For effective screening oftentimes the flux must be pasty or very viscous. A stencil is a metal mask that contains an array of holes that match the dimensions and spacing of the contact pads on the given wafer or substrate. The holes in the stencil are aligned over the contact pads.

Following the fluxing step, solder spheres are brought into contact with the fluxed contact pads and reflowed to make the electrical connection. As the center to center spacing of solder bumps becomes smaller and smaller, the ability to make cost affordable stencils becomes more difficult. Shrinking bump pitches also translates into smaller contact pads and solder spheres as well as correspondingly smaller holes in the stencil. Smaller holes places special constraints on the chemical composition and texture of fluxes in order for them to excrete through the holes and still form uniform sized droplets on the contact pads. The forces required to force the flux through small holes can also become quite excessive resulting in stencil damage.

Solder spheres formed on the contact pads of a wafer by electroplating, evaporation or printed solder paste are often sprayed with an aqueous flux solution before a reflow cycle is performed. Flux applied in this manner ends up on areas other than the contact pads of the wafer resulting in excessive flux residue. In order to provide a clean surface for subsequent processing, the excessive flux residue must be removed by a follow on clean-up process that may not be 100% effective at removing all residues.

Bumped dies sawed from the reflowed wafer are oftentimes fluxed by dipping the spheres into a thin layer of flux. The fluxed dies are then placed on a substrate and reflowed to complete the attachment. This approach will only work if the solder bumps are fairly uniform in height and if the die is flat and parallel to the flux layer ensuring that all the solder bumps make contact to the flux. The larger the die the more difficult it is to achieve and maintain a parallel surface to the flux layer. Hence, this approach does not work very well with larger die or wafers.

SUMMARY OF THE INVENTION

In order to produce a functional electronic device, it is preferable that the areas surrounding solder areas are cleaned and remain clean. Current techniques used to flux electronic components exhibit many flaws such as, using excessive flux, which causes residue that may effect the reliability of the electronic component. For example, excessive flux residue has been shown to degrade the mechanical adhesion between various interfaces of flip-chip packages sufficiently to result in reliability problems.

The method of the present invention comprises applying flux prior to loading the solder particles to the substrate. The method comprises the steps of applying flux to solder particles, loading solder particles onto an adhesive coated film, that includes adhesive areas corresponding to the pattern of contact pads on the surface of the substrate. The method also includes loading the solder particles onto contact pads of an electronic component and reflowing the solder particles to attach the solder particles to the contact pads. The method of applying flux to solder particles prior to loading adhesive coated film isolates flux to solder particles and contact pad interfaces, thus reducing flux usage. Reducing flux usage tempers any excessive flux residue collection. The method of applying flux to solder particles prior to loading particles to the substrate eliminates the use of stencils required to apply flux to contact pads located on the substrate. The method of applying flux to solder particles is independent of solder particle size.

Alternatively, a method for applying flux to solder particles may comprise loading solder particles on the adhesive areas of an adhesive coated film, and applying a flux to the exposed solder particles. The solder particles may then be loaded onto contact pads of the substrate from the adhesive coated film.

The method of applying flux to the exposed solder particles reduces flux usage. Applying flux to the exposed solder particles isolates flux to the solder particles and contact pad interfaces. Applying flux to the exposed solder particles eliminates the use of stencils required to apply flux to contact pads located on the electronic component. Additionally, applying flux to the exposed solder particles is independent of the solder particle size.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1:
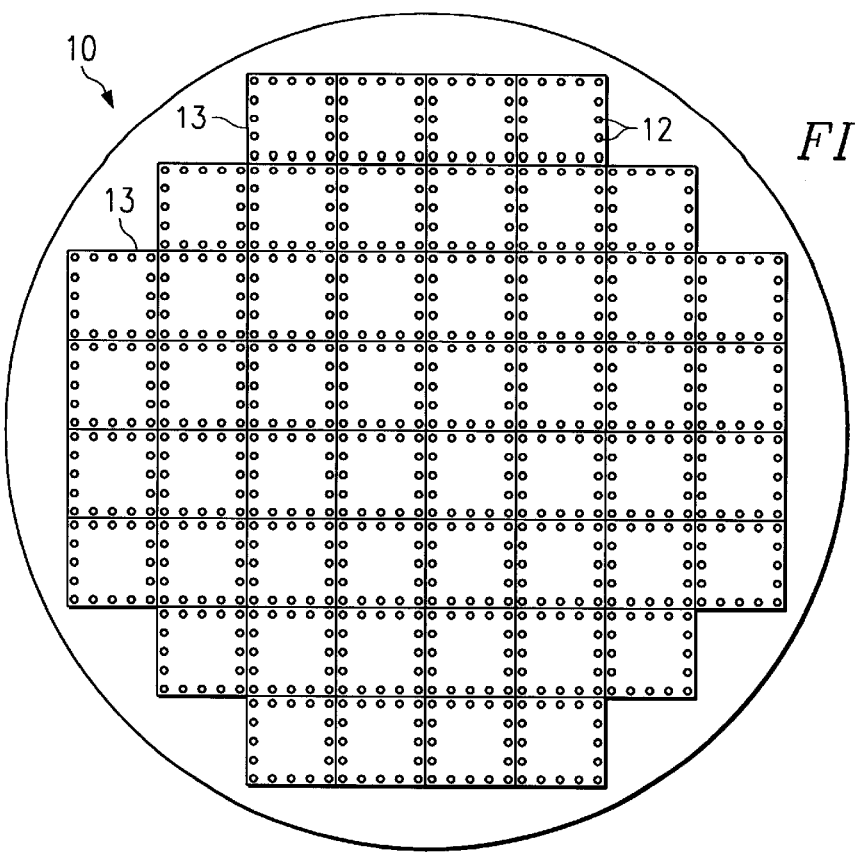
FIG. 1 is a plan view of a semiconductor wafer manufactured utilizing the principles of the present invention.

Reference is now made to FIG. 1, in which an exemplary semiconductor wafer populated with a plurality of die 13 are shown and generally designated as 10. In one embodiment, the present invention provides a method for applying solder flux to a plurality of contact pads 12 across the surface of die 13. Solder particles 14 (not shown in FIG. 1) are typically attached to contact pads 12 by means of reflow. The key to good solderability lies in ensuring that the surfaces to be joined are clean. The cleanness must be maintained during soldering, so that a metallic continuity at the interface can be achieved.

Solder particles 14 are typically solder spheres having a diameter in a range of approximately 3 mils to approximately 30 mils; however, it should be appreciated by persons skilled in the art that the principles of the present invention are applicable to solder particles 14 of other dimensions and configurations, such as rectangular or cylindrical columns. Solder coated metal balls can be used in place of ordinary solder balls.

Also, solder particles 14 may be attached directly to other substrates, such as an interposer or an integrated circuit in a flip-chip package. Electronic substrates or interposers consist of an insulating material having electrically conductive paths extending through the interposer from the surface to the opposite surface forming electrical entry and exit paths.

Figure 2A:
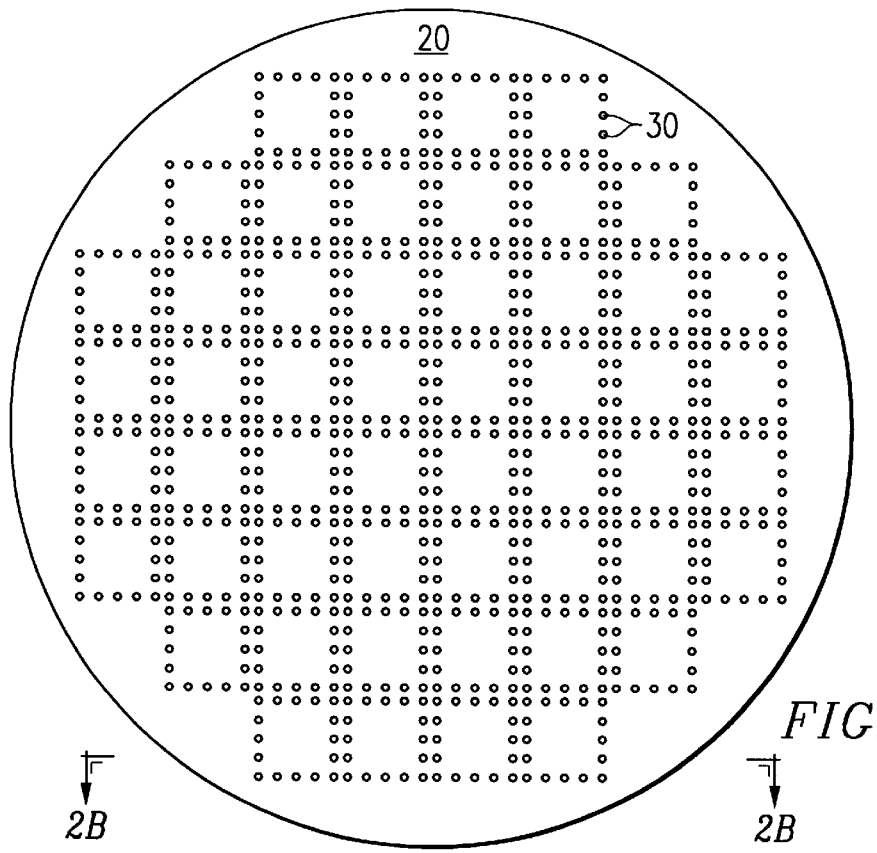
FIG. 2A is a plan view of an adhesive coated film for use in the present invention.
Figure 2B:
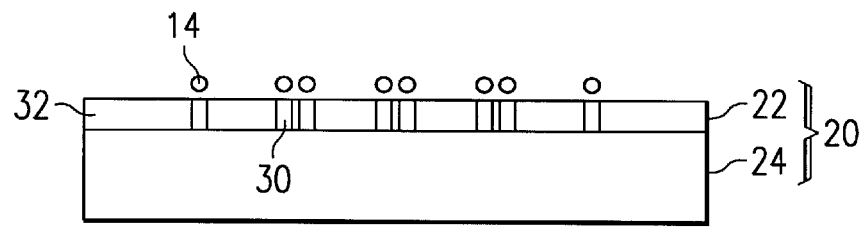
FIG. 2B is a cross sectional view taken along line 2B—2B of FIG. 2A.

Solder particles 14 are transferred onto a plurality of die 13 by populating an adhesive coated film 20 with particles 14, FIGS. 2A and 2B. The film 20 is aligned over the wafer 10 and the particles 14 are transferred onto the plurality of die 13. A replicated image of the die 13 is created using a film 24 with a photoimageable adhesive coating 22 applied across the surface of the film 24. The adhesive coating 22 comprises a plurality of adhesive areas 30 with adhesive areas 30 corresponding to the pattern of contact pads 12 across the surface of the die 13. Flux is applied to solder particles 14 prior to solder particles 14 being transferred onto the individual die 13 of wafer 10. Flux may be applied to solder particles 14 by a spray or dip process The present invention illustrates two methods of applying flux prior to loading particles 14 to wafer 10.

The term "flux" customarily refers to systems such as R-type, RMA-type, water-soluble type, no-clean type, that are applied to the surface to react with metal oxides or nonmetallic contaminants and remove them from the metal surfaces. Common metal surfaces that are joined by soldering include Sn/Pb, Sn, Cu, Au, Pb, Ag, Ag/Pd, Au/Pt, Ni, and Au/Ni/Cu. Each of these surfaces has its own associated fluxing chemistry. The embodiment of the present invention may be used with any flux chemistry system since the invention addresses problems associated with applying the flux rather than the system used.

FIG. 2A is a plan view of adhesive sheet 20 comprising a plurality of adhesive areas 30. In one embodiment of the invention, adhesive sheet 20 comprises an adhesive coating 22 laminated onto a film 24 such as Kapton® or Mylar®, for example, as shown in the cross-sectional view of FIG. 2B. Adhesive coating 22 is typically approximately 4 to 6 microns thick, and film 24 is typically approximately 50 microns thick; however, it should be understood by one skilled in the art the principles of the present invention are applicable to varying thicknesses.

In forming adhesive sheet 20, photolithography may be utilized to create a plurality of discrete adhesive areas 30 and non-adhesive areas 32. A more complete description of adhesive patterns formed utilizing photolithography may be found in U.S. Pat. No. 5,356,751, issued to Cairncross, et. al., the contents of which are incorporated herein by reference.

A cross sectional view of adhesive sheet 20, is shown in FIG. 2B. A pattern or array of adhesive areas 30 corresponds to the pattern of contact pads on substrate 16 (not shown in FIG. 2B) onto which solder particles 14 will be attached, for example. Adhesive areas 30 are typically circular areas suitable for receiving spherical solder particles 14; however, it should be appreciated by one skilled in the art that the principles of the present invention are applicable to adhesive areas 30 of other configurations, such as oval, square, rectangular, and others. Also, the diameter of adhesive areas 30 is typically approximately half the diameter of solder particles 14; however, it should be appreciated by one skilled in the art that the principles of the present invention are applicable to adhesive areas 30 of other dimensions.

Figure 3A:
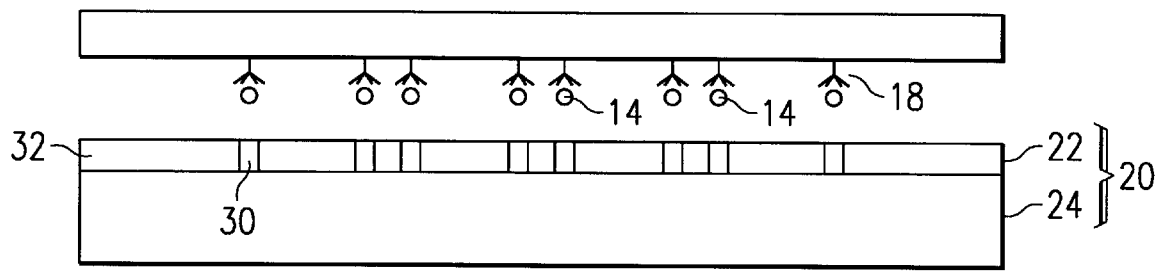
FIG. 3A is a cross-sectional view depicting the method of applying flux to solder particles prior to loading solder particles to adhesive areas of adhesive coated film in accordance with the current invention.

Turning now to FIG. 3A where solder particles 14 are coated with flux 18 prior to being loaded onto adhesive coated film 20. The flux 18 is allowed to dry before transferring the solder particles 14 to the adhesive surface 22. The amount of flux 18 used for a given application is reduced since the flux 18 is isolated to only the solder particles 14. Often the activating agents of these fluxes leave potentially corrosive residues that could result in subsequent electrical performance problems. The use of less flux will greatly reduce the amount of these corrosive residues, hence increasing component reliability. Typically, stencils are used to flux contact pads on a, substrate. Due to decreasing pitches and the constraints; placed on the chemical composition and texture of fluxes in order to excrete through decreased holes in the stencil, and the costs associated with manufacturing stencils capable of handling decreased pitches, limits have been placed on the use of stencils. Applying flux to solder particles 14 prior to transferring solder particles 14 eliminates the need to use stencils. Therefore, the pre-flux method is independent of the size of the solder particle 14. The pre-flux method may be used for all areas of interest from dies to wafers to electronic substrates or interposer, as an example.

Figure 3B:
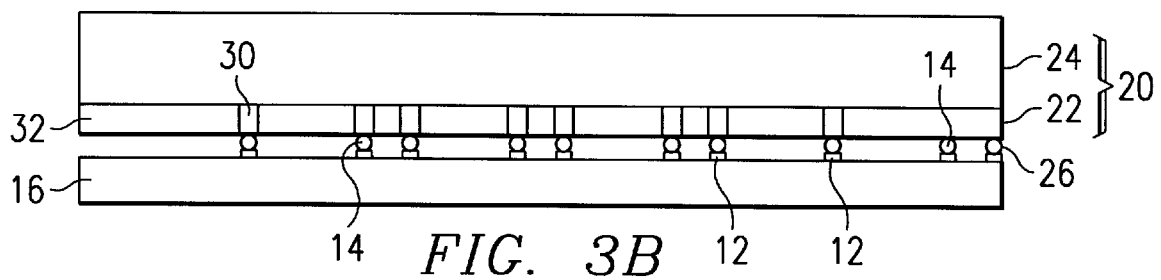
FIG. 3B is a cross sectional view depicting solder particles loaded into a electronic component in accordance with the present invention.
Figure 3C:
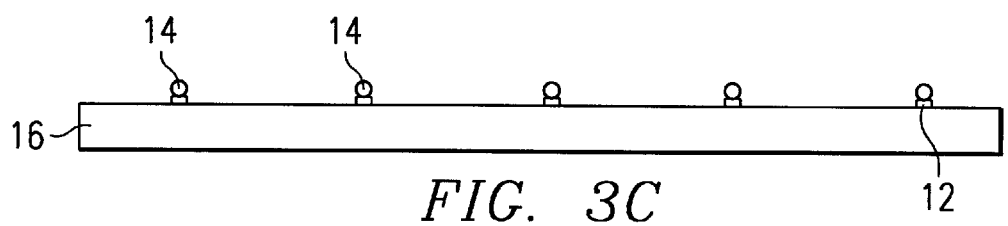
FIG. 3C is a cross-sectional view of an electronic component with solder particles loaded on contact pads in accordance with the present invention.

Once the flux 18 is applied to the solder particles 14 the solder particles 14 are loaded onto the adhesive film 20. During or directly following the step of applying flux 18 to solder particles 14 is the step of loading, or transferring solder particles 14 onto substrate 16 as depicted in FIG. 3B. A plurality of solder particles 14 are transferred or attached to substrate 16 by reflowing to substrate 16 as depicted in FIG. 3C.

Solder particles 14 used in the present invention may be securely attached to contact pads 42 using a variety of solder reflow systems, such as an optical heating reflow system, a vapor phase solder reflow system, or other solder reflow systems. For example, in an optical heating reflow system, radiant heat from near infrared optical sources such as tungsten-halogen lamps may be utilized for rapid thermal ramping with minimal thermal inertia, thereby shortening cycle time.

Figure 4A:
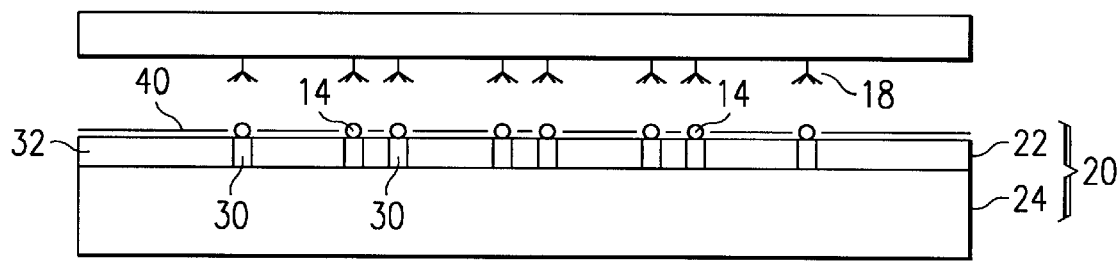
FIG. 4A is a cross-sectional view depicting a method of applying flux to solder particles following loading the solder particles to the adhesive areas of the adhesive coated film in accordance with the present invention.
Figure 4B:
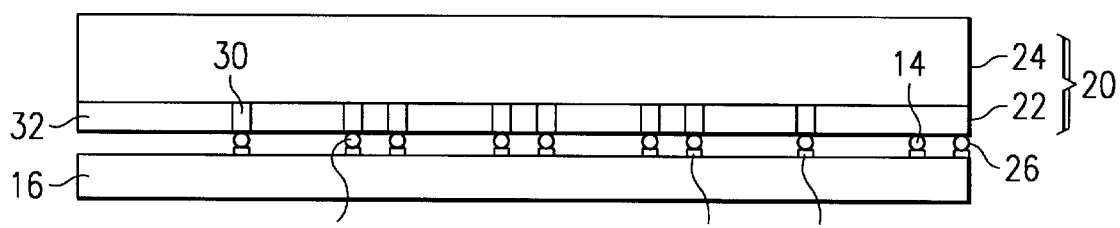
FIG. 4B is a cross sectional view depicting solder particles loaded onto the surface of the electronic component in accordance with the present invention.

Is Alternatively, flux 18 may be applied to solder particles 14 as depicted in FIG. 4A. Flux 18 is sprayed onto the solder particles 14 while solder particles 14 are affixed to a populated adhesive film 20. A ring 40 may be attached to or placed across the surface of the adhesive film 20 leaving the solder particles 14 exposed. A light coating of soldering flux 18 may be sprayed onto the solder particles 14, the flux is allowed to dry, and the solder particles are aligned with contact pads 12 of substrate 16 as depicted in FIG. 4B. The solder particles 14 may then, be reflowed to the substrate 16.

The advantages of applying flux 18 after loading the solder particles 14 onto the adhesive coated film 20 include reducing the amount of flux 18 used for a given application, isolating the flux 18 to only the interfaces between solder particles 14 and contact pads 12 and reducing flux 18 usage tempers any excessive flux residue collection. Additionally, no stencils are required and the method is independent of solder particle size. The method is suitable for all areas of interest including dies, wafers and electronic substrates or interposers, and does not intrude into the process of populating the adhesive film 20 with solder particles 14.

Figure 4C:
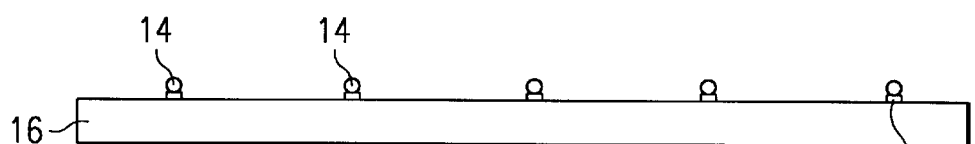
FIG. 4C is a cross sectional view of an electronic component with solder particles loaded on contact pads in accordance with the present invention.
Figure 5:
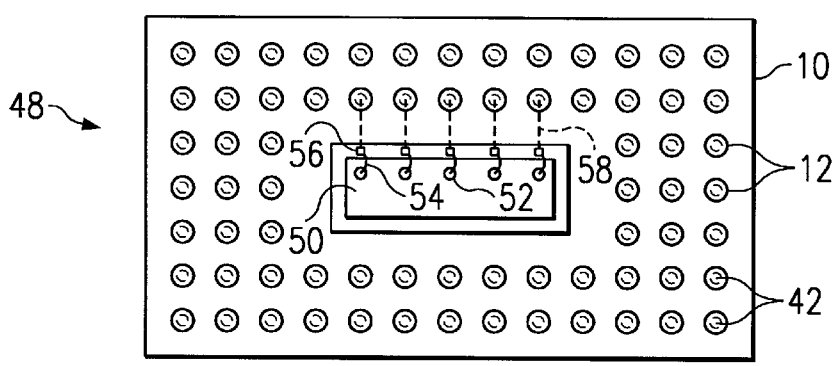
FIG. 5 is a plan view of a semiconductor device showing an alternate array of contact pads to be provided with solder particles in accordance with the invention.

Removal of adhesive sheet 20 from solder particles 14 results in substrate 16 with solder particles 14 attached to contact pads 12, as depicted in FIG. 4C. Substrate 16 may be used in a variety of integrated circuit packages, such as a ball grid array package, a flip-chip package, or a electronic interposer. Substrate 16 may also be a semiconductor wafer 10.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for loading particles onto an substrate comprising the steps of:
    adhering the particles to adhesive areas on an adhesive coated film;
    applying a solder flux to the particles; and
    transferring said particles from said film onto contact pads of an substrate.

2. The method as recited in claim 1, further comprising the step of placing a metallic ring across the adhesive coated film leaving the solder particles exposed.

3. The method as recited in claim 1 wherein said particles are composed of solder alloy.

4. The method as recited in claim 1 wherein said particles are spheres.

5. The method as recited in claim 1 wherein said substrate is part of an integrated circuit package.

6. The method as recited in claim 1 wherein said substrate is a semiconductor wafer.

7. The method as recited in claim 1 wherein said substrate is a ball grid array package.

8. The method as recited in claim 1 wherein said substrate is a flip-chip package.

9. The method as recited in claim 1, further comprising the step of reflowing the particles to securely attach the particles to the contact pads.

10. An integrated circuit package produced by the method of claim 1.

11. A method in claim 1 wherein said transfer includes the step of aligning said adhesive areas with said contact pads, and then bringing said film in contact with said substrate, such that each of said particles contacts one of said pads, respectively.

* * * * *